(12) United States Patent
Koo et al.

(10) Patent No.: US 7,348,277 B2
(45) Date of Patent: Mar. 25, 2008

(54) METHODS OF FABRICATING SEMICONDUCTOR DEVICE USING SACRIFICIAL LAYER

(75) Inventors: Ja-Eung Koo, Goyang-si (KR); Byung-Lyul Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/352,640

(22) Filed: Feb. 13, 2006

(65) Prior Publication Data

US 2006/0183333 A1    Aug. 17, 2006

(30) Foreign Application Priority Data

Feb. 14, 2005    (KR) .............. 10-2005-0012082

(51) Int. Cl.
*H01L 21/302* (2006.01)
*H01L 21/461* (2006.01)

(52) U.S. Cl. ............... 438/692; 438/700; 216/88
(58) Field of Classification Search ........ 438/692, 438/700; 216/88
See application file for complete search history.

(56) References Cited

U.S. PATENT DOCUMENTS

| | | | |
|---|---|---|---|
| 5,969,409 A | 10/1999 | Lin | 257/637 |
| 6,599,838 B1 | 7/2003 | Shih et al. | 438/692 |
| 2004/0084780 A1* | 5/2004 | Yew et al. | 257/774 |
| 2004/0132281 A1* | 7/2004 | Ingerly et al. | 438/638 |
| 2004/0214442 A1* | 10/2004 | Lee et al. | 438/692 |
| 2005/0054194 A1* | 3/2005 | Tsai et al. | 438/638 |
| 2005/0090094 A1* | 4/2005 | Oh et al. | 438/633 |

FOREIGN PATENT DOCUMENTS

| | | |
|---|---|---|
| KR | 10-2004-0017475 | 2/2004 |
| KR | 10-2004-0054142 | 6/2004 |

\* cited by examiner

*Primary Examiner*—Nadine G. Norton
*Assistant Examiner*—Mahmoud Dahimene
(74) *Attorney, Agent, or Firm*—Mills & Onello LLP

(57) ABSTRACT

There are provided methods of fabricating a semiconductor device using a sacrificial layer. The methods provide an approach to maintaining thickness distribution of the interlayer insulating layers below a sacrificial layer uniform on an overall surface of a semiconductor substrate during performing a chemical mechanical polishing (CMP) process in a damascene process. To this end, the method includes forming a pad layer, a pad interlayer insulating layer, an etch stop layer pattern, a planarized interlayer insulating layer and a sacrificial layer sequentially on a semiconductor substrate. At least one trench is formed in the sacrificial layer and the planarized interlayer insulating layer. A via contact hole is formed in the etch stop layer pattern, the pad interlayer insulating layer, and the pad layer to be disposed below the trench. A diffusion barrier layer and a conductive layer are sequentially formed to fill the trench and the via contact hole. A CMP process is performed on the conductive layer, the diffusion barrier layer, and the sacrificial layer.

14 Claims, 13 Drawing Sheets

METHODS OF FABRICATING SEMICONDUCTOR DEVICE USING SACRIFICIAL LAYER

CROSS-REFERENCE TO RELATED APPLICATION

This patent application claims priority from Korean Patent Application No. 10-2005-0012082, filed Feb. 14, 2005, the contents of which are hereby incorporated by reference in their entirety.

BACKGROUND OF INVENTION

1. Technical Field

The present invention relates to methods of fabricating a semiconductor device, and more particularly, to methods of fabricating a semiconductor device using a sacrificial layer.

2. Discussion of the Related Art

Recently, research is being carried out into increasing process margins in semiconductor fabrication processes on a semiconductor device in order to electrically connect discrete elements to one another on a semiconductor substrate, using interlayer insulating layers. One approach involves the use of a chemical mechanical polishing (CMP) process on the interlayer insulating layers. The semiconductor fabrication processes include a photolithography process, an etch process, and a deposition process. The interlayer insulating layers are formed on a semiconductor substrate to cover discrete elements and isolate them. In general, interlayer insulating layers have been used with excellent planarization characteristics through the CMP process for removing step height differences between discrete elements and the semiconductor substrate, and between the discrete elements. The planarization characteristics of the interlayer insulating layers may improve process margins of a photolithography process, an etch process, and a deposition process in a given design rule. However, thicknesses of the interlayer insulating layers on the overall surface of the semiconductor substrate cannot be maintained uniform by the CMP process. In addition to intrinsic step height differences of the discrete elements, additional step height differences are formed on predetermined regions of the semiconductor substrate due to intrinsic characteristics of a polishing equipment system used during performing the CMP process. The intrinsic characteristics depend on a pad, a carrier head, and lifetime of consumptive conditioners of the polishing equipment system. As such, the CMP process may reduce process margins of photolithography, etch and deposition processes.

In one approach to these familiar problems, U.S. Pat. No. 6,599,838 to Tsu Shih, et. al (the '838 patent), which is incorporated herein by reference, discloses a method for forming metal filled semiconductor features to improve a subsequent metal CMP process. According to the '838 patent, the method includes preparing a semiconductor processing substrate on which first and second dielectric insulating layers are sequentially disposed. The first and second dielectric insulating layers have openings. The second dielectric insulating layer is formed to have a removal rate ½ or less than that of the first dielectric insulating layer in the CMP process. Metal is formed on the second dielectric insulating layer to fill the openings. Then, the CMP process is performed on the metal until the second dielectric insulating layer is exposed.

However, the method cannot planarize the upper surface of the semiconductor substrate by using the second dielectric insulating layer. This is because the upper surface of the first dielectric insulating layer before performing the CMP process may not be planarized by the method. Further, a thickness of the second dielectric insulating layer on the overall surface of the semiconductor substrate may not be maintained uniform due to intrinsic characteristics of the polishing equipment system after performing the CMP process.

SUMMARY OF THE INVENTION

Therefore, according to some embodiments of the present invention, there are provide methods of fabricating a semiconductor device using a sacrificial layer for planarizing an upper surface of a semiconductor substrate through a chemical mechanical polishing (CMP) process.

According to one aspect, the present invention provides a method of fabricating a semiconductor device using a sacrificial layer. The method includes forming a pad layer, a pad interlayer insulating layer, an etch stop layer, a planarized interlayer insulating layer, and a sacrificial layer sequentially on a semiconductor substrate. At least one trench is formed in the sacrificial layer and the planarized interlayer insulating layer. At least one via contact hole is formed in the etch stop layer, the pad interlayer insulating layer, and the pad layer. The via contact hole is formed under the trench. A diffusion barrier layer and a conductive layer are sequentially formed on the sacrificial layer to fill the trench and the via contact hole. A chemical mechanical polishing (CMP) process is performed at least one time on the conductive layer, the diffusion barrier layer, and the sacrificial layer. The CMP process is performed until the planarized interlayer insulating layer is exposed.

According to another aspect, present invention is directed to a method of fabricating a semiconductor device using a sacrificial layer. The method includes forming a pad layer, a pad interlayer insulating layer, an etch stop layer, a planarized interlayer insulating layer, and a sacrificial layer sequentially on a semiconductor substrate. At least one trench is formed in the sacrificial layer and the planarized interlayer insulating layer. At least one via contact hole is formed in the etch stop layer, the pad interlayer insulating layer, and the pad layer. The via contact hole is formed under the trench. A diffusion barrier layer and a conductive layer are sequentially formed on the sacrificial layer to fill the trench and the via contact hole. A CMP process is performed at least one time on the conductive layer, the diffusion barrier layer, and the sacrificial layer. The CMP process is performed until the planarized interlayer insulating layer is exposed. The sacrificial layer is formed using an insulating layer having a higher etching ratio than that of the planarized interlayer insulating layer.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
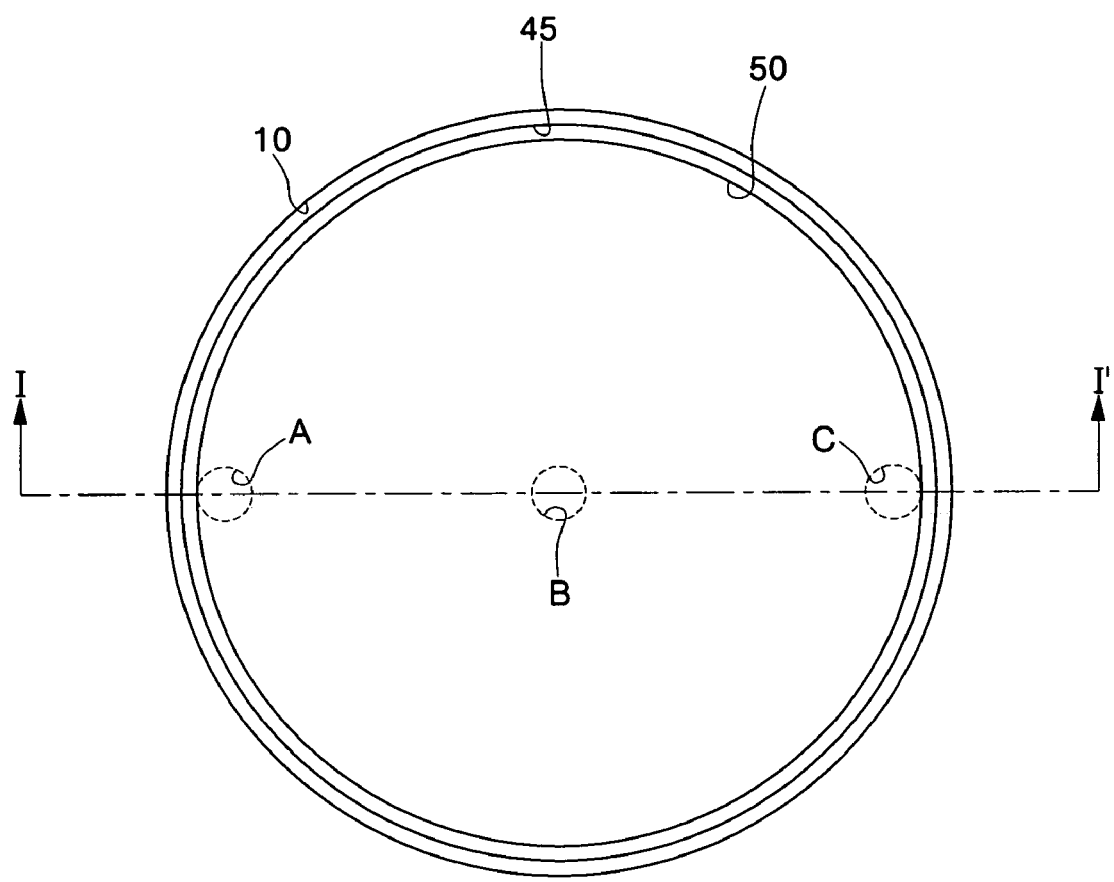
FIG. 1 is a plan view showing a semiconductor substrate according to the present invention.

FIG. 1 is a plan view showing a semiconductor substrate according to the present invention, and FIGS. 2 through 11 are cross-sectional views illustrating a method of fabricating a semiconductor device taken along line I-I' of FIG. 1.

Figure 2:
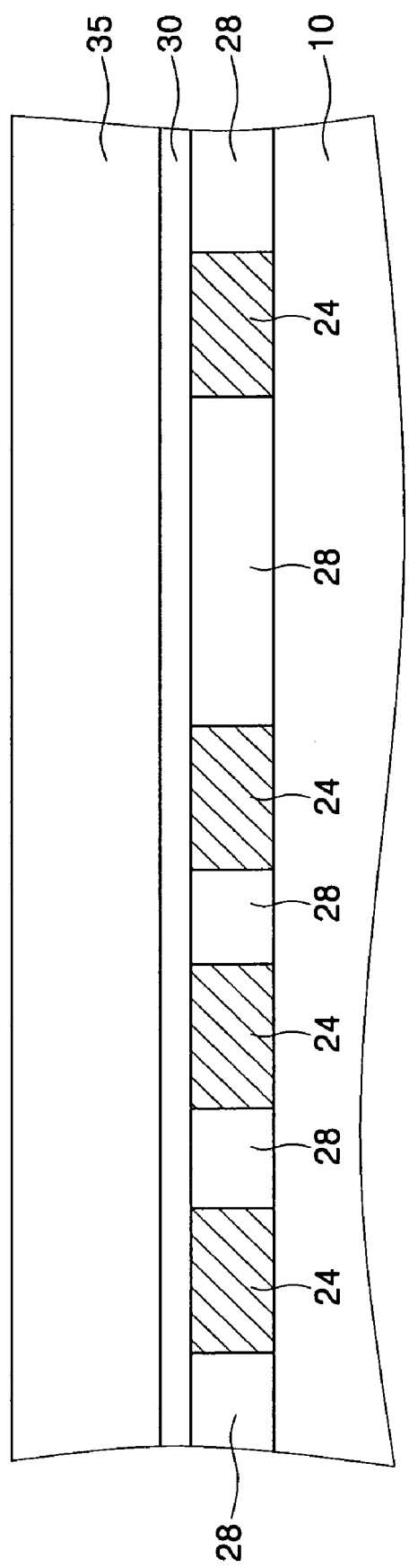
FIGS. 2 through 11 are cross-sectional views illustrating a method of fabricating a semiconductor device taken along line I-I' of FIG. 1.

Referring to FIGS. 1 and 2, a plurality of lower patterns 24 are formed on a semiconductor substrate 10. The lower patterns 24 are formed on the overall surface of the semiconductor substrate 10. The lower patterns 24 are preferably formed of copper (Cu). A buried interlayer insulating layer 28 and a pad layer 30 are sequentially formed on the semiconductor substrate 10 to cover the lower patterns 24. A pad interlayer insulating layer 35 is formed on the pad layer 30. The pad layer 30 is preferably formed using an insulating layer having an etching ratio different from those of the pad interlayer insulating layer 35 and the buried interlayer insulating layer 28. The buried interlayer insulating layer 28 is preferably formed to have the same etching ratio as that of the pad interlayer insulating layer 35.

Figure 3:
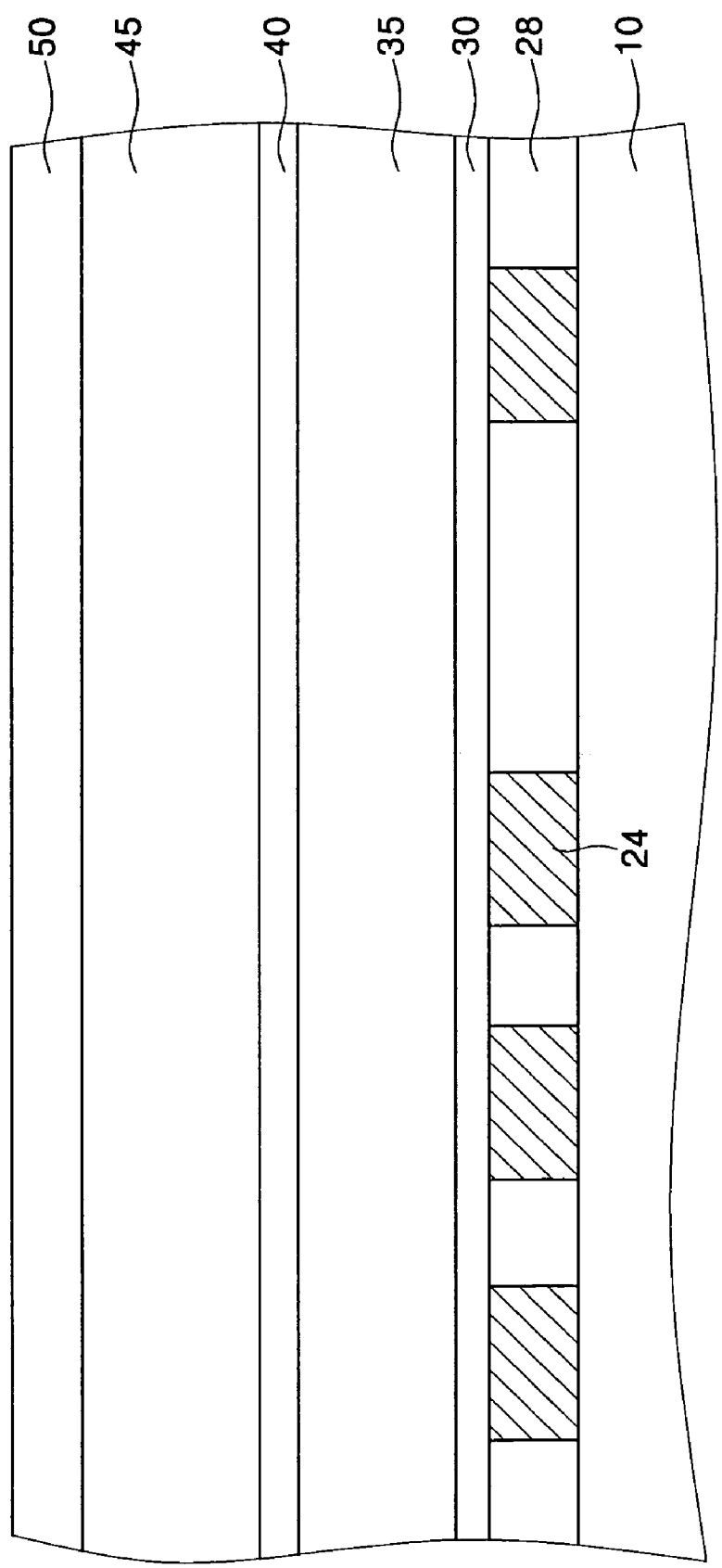

Referring to FIGS. 1 and 3, an etch stop layer 40 and a planarized interlayer insulating layer 45 are sequentially formed on the pad interlayer insulating layer 35. Then, a sacrificial layer 50 is formed on the planarized interlayer insulating layer 45. The planarized interlayer insulating layer 45 and the sacrificial layer 50 may be formed on the semiconductor substrate 10 as shown in FIG. 1. The sacrificial layer 50 is preferably formed of an insulating layer having an etching ratio different from that of the planarized interlayer insulating layer 45. The planarized interlayer insulating layer 45 is preferably formed of an insulating layer having an etching ratio different from that of the etch stop layer 40. The planarized interlayer insulating layer 45 is preferably formed of an insulating layer having the same etching ratio as that of the pad interlayer insulating layer 35. At this time, the sacrificial layer 50 preferably has an etching ratio different from that of the etch stop layer 40.

According to the present invention, the sacrificial layer 50 is preferably formed using an insulating layer having a higher polishing rate or a higher polishing speed than that of the planarized interlayer insulating layer 45 via a chemical mechanical polishing (CMP) process. In a case in which the planarized interlayer insulating layer 45 is formed using fluorine-doped silicon glass (FSG), the sacrificial layer 50 is preferably formed using BPSG, SiON, or low-k material. The low-k material preferably uses BLACK DIAMOND® dielectric material, CORAL® dielectric material, AURORA® dielectric material, or a material having a dielectric constant similar to those described above. BLACK DIAMOND® is a registered trademarked product of Applied Materials, Inc. The BLACK DIAMOND® dielectric material is known to one of ordinary skill in the art at the time of the invention as typically having a dielectric constant in the range of about 2.4 to 3.0. CORAL® is a registered trademarked product of Novellus Systems, Inc. The CORAL® dielectric material is known to one of ordinary skill in the art at the time of the invention as typically having a dielectric constant in the range of about 2.4 to 2.7. AURORA® is a registered trademarked product of Nippon ASM. The AURORA® dielectric material is known to one of ordinary skill in the art at the time of the invention as typically having a dielectric constant of approximately 2.7. Alternatively, in the case that the planarized interlayer insulating layer 45 is formed using BLACK DIAMOND® dielectric material, CORAL® dielectric material, AURORA® dielectric material, or a material having a dielectric constant similar to those described above, the sacrificial layer 50 may use a lower-k material having a lower dielectric constant than that of the low-k material. The lower-k material preferably uses nanoporous material sold under the trademark NANOGLASS®, Benzocyclobutene (BCB) by The Dow Chemical Company, Fluorinated polyarylene ethers (Flare) by Honeywell, Inc., Aluminum, Calcium, and Phosphorus (ALCAP) by Asahi Chemical Co., Ltd., or Low-k dielectric (LKD) by JSR Microelectronics, Inc., or a material having a dielectric constant less than that of the low-k materials described above. NANOGLASS® is a registered trademarked product of Honeywell. Inc. Nanoporous dielectric material sold under the trademark NANOGLASS® is known to one of ordinary skill in the art at the time of the invention as typically having a dielectric constant in the range of about 1.8 to 2.2. BCB is known to one of ordinary skill in the art at the time of the invention as typically having a dielectric constant of approximately 2.65. Flare is known to one of ordinary skill in the art at the time of the invention as typically having a dielectric constant of approximately 2.8. ALCAP is known to one of ordinary skill in the art at the time of the invention as typically having a dielectric constant in the range of about 1.8 to 2.3. LKD is known to one of ordinary skill in the art at the time of the invention as typically having a dielectric constant in the range of about 2.5 to 2.7.

Figure 4:
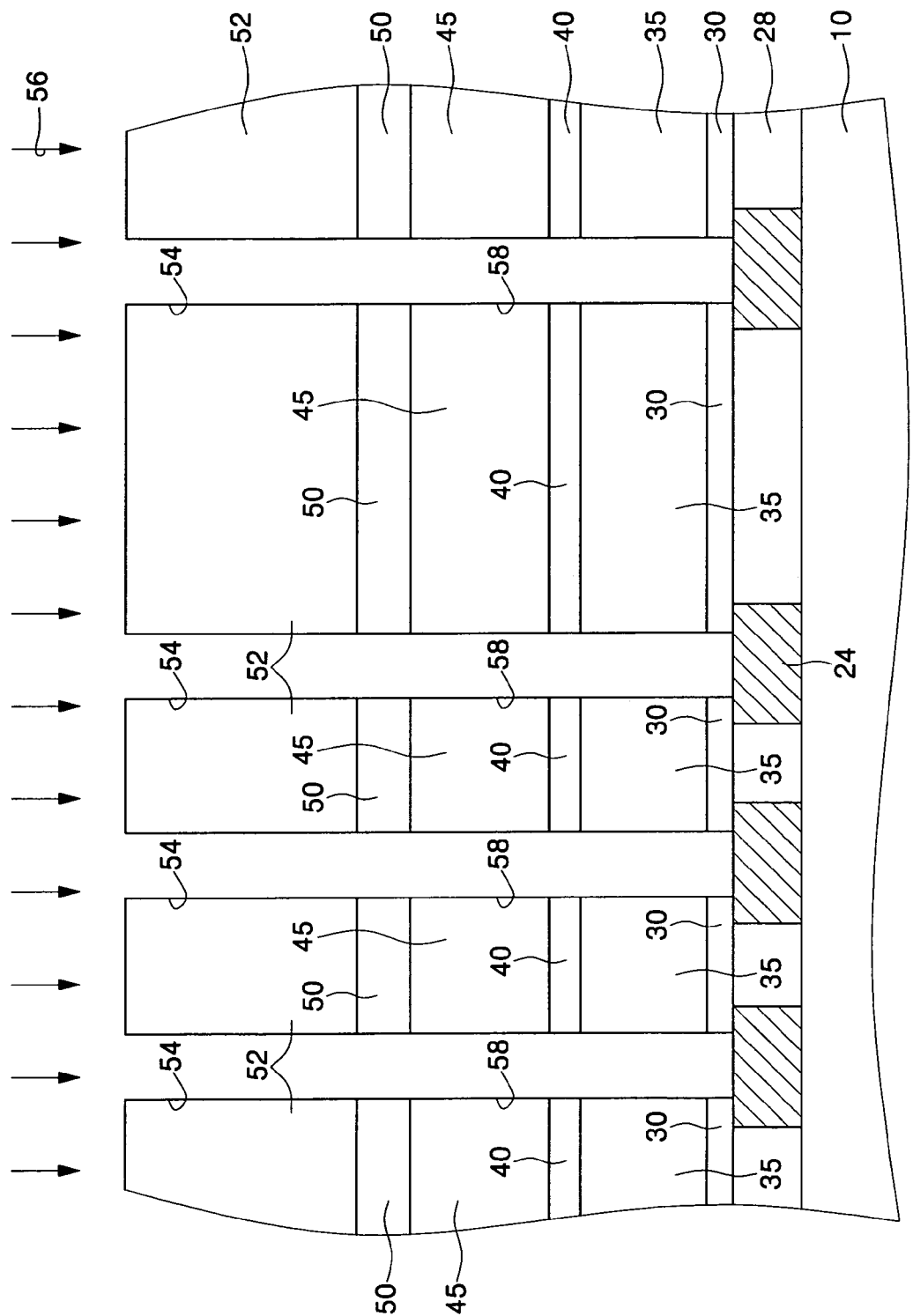

Referring to FIGS. 1 and 4, a photoresist layer 52 is formed on the sacrificial layer 50. The photoresist layer 52 is formed to have openings 54 on the lower patterns 24. Using the photoresist layer 52 as an etch mask, an etch process 56 is sequentially performed on the sacrificial layer 50, the planarized interlayer insulating layer 45, the etch stop layer 40, the pad interlayer insulating layer 35, and the pad layer 30 via the openings 54. The etch process 56 forms via contact holes 58 in the pad layer 30, the pad interlayer insulating layer 35, the etch stop layer 40, the planarized interlayer insulating layer 45, and the sacrificial layer 50 to expose the lower pattern 24.

After the formation of the via contact holes 58, the photoresist layer 52 is removed from the semiconductor substrate 10.

Figure 5:
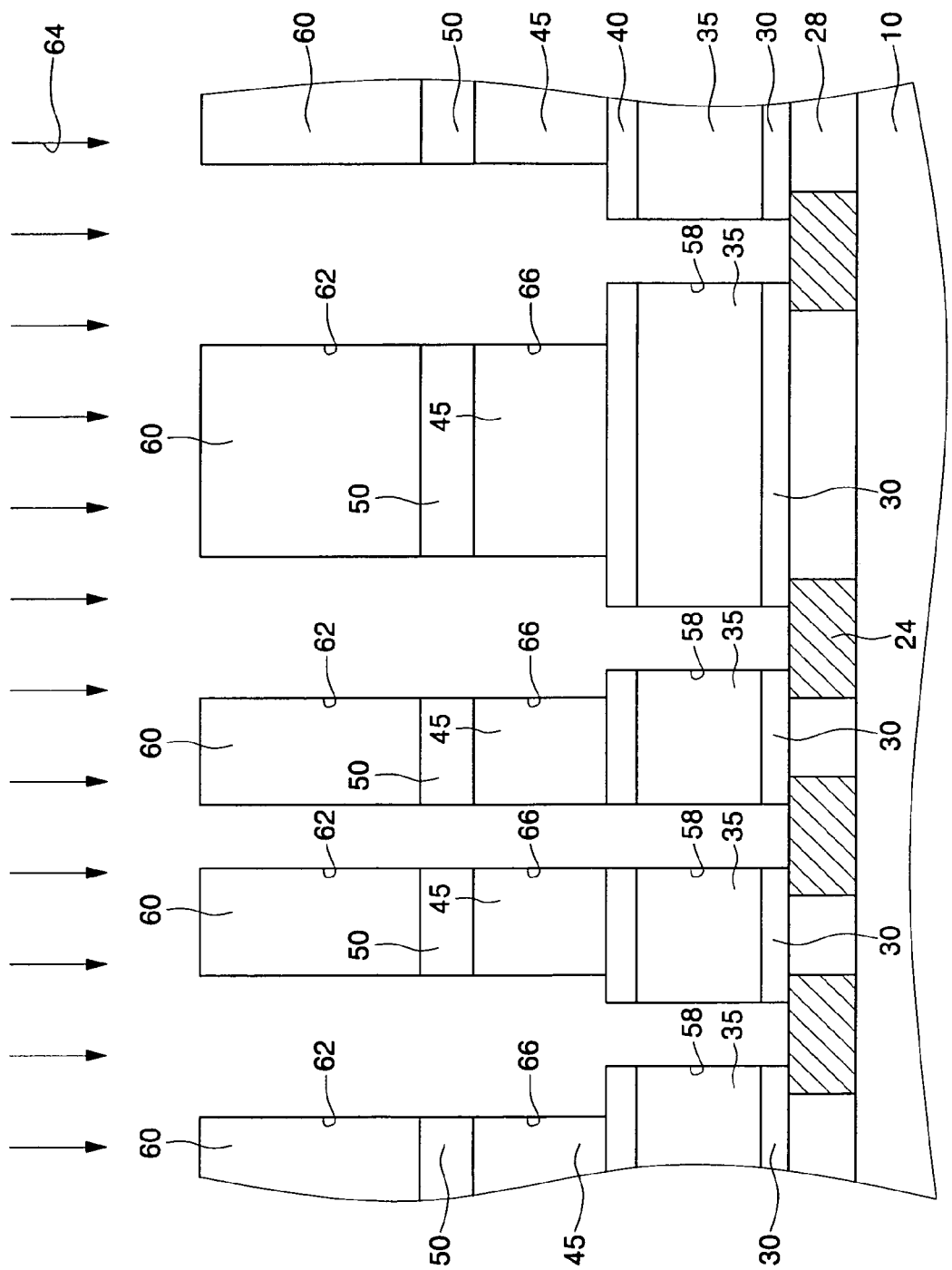
Figure 6:
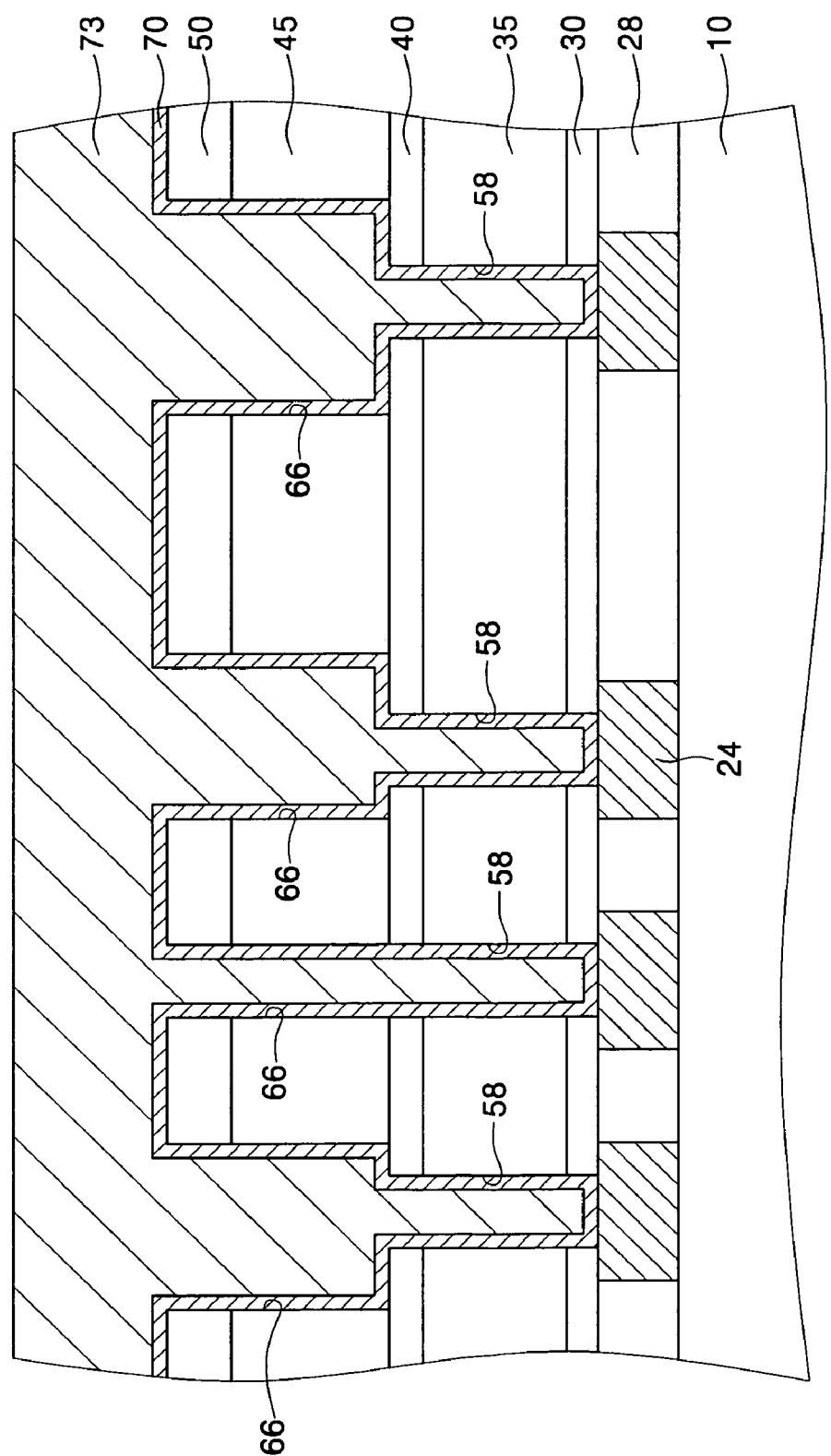

Referring to FIGS. 1 and 5, a photoresist layer 60 is formed on the sacrificial layer 50. The photoresist layer 60 is formed to have openings 62 on the via contact holes 58 respectively. Using the photoresist layer 60 as an etch mask, an etch process 64 is sequentially performed on the sacrificial layer 50 and the planarized interlayer insulating layer 45 through the openings 62. The etch process 64 forms trenches 66 on the via contact holes 58 respectively. At this time, the lower patterns 24 may be exposed through the trenches 66 and the via contact holes 58. A width of the via contact hole 58 is preferably shorter than a width of the trench 66.

After the formation of the trenches 66, the photoresist layer 60 is removed from the semiconductor substrate 10.

Referring to FIGS. 1, and 6 through 8, a diffusion barrier layer 70 and a conductive layer 73 are sequentially formed on the sacrificial layer 50 to fill the via contact holes 58 and the trenches 66. The diffusion barrier layer 70 is preferably formed to conformally cover the trenches 66 and the via contact holes 58. The diffusion barrier layer 70 is preferably formed using tantalum nitride (TaN) and titanium (Ti), which are sequentially stacked. Alternatively, the diffusion barrier layer 70 may be formed using tantalum nitride (TaN) or titanium (Ti) individually. The conductive layer 73 is preferably formed using copper (Cu).

Figure 7:
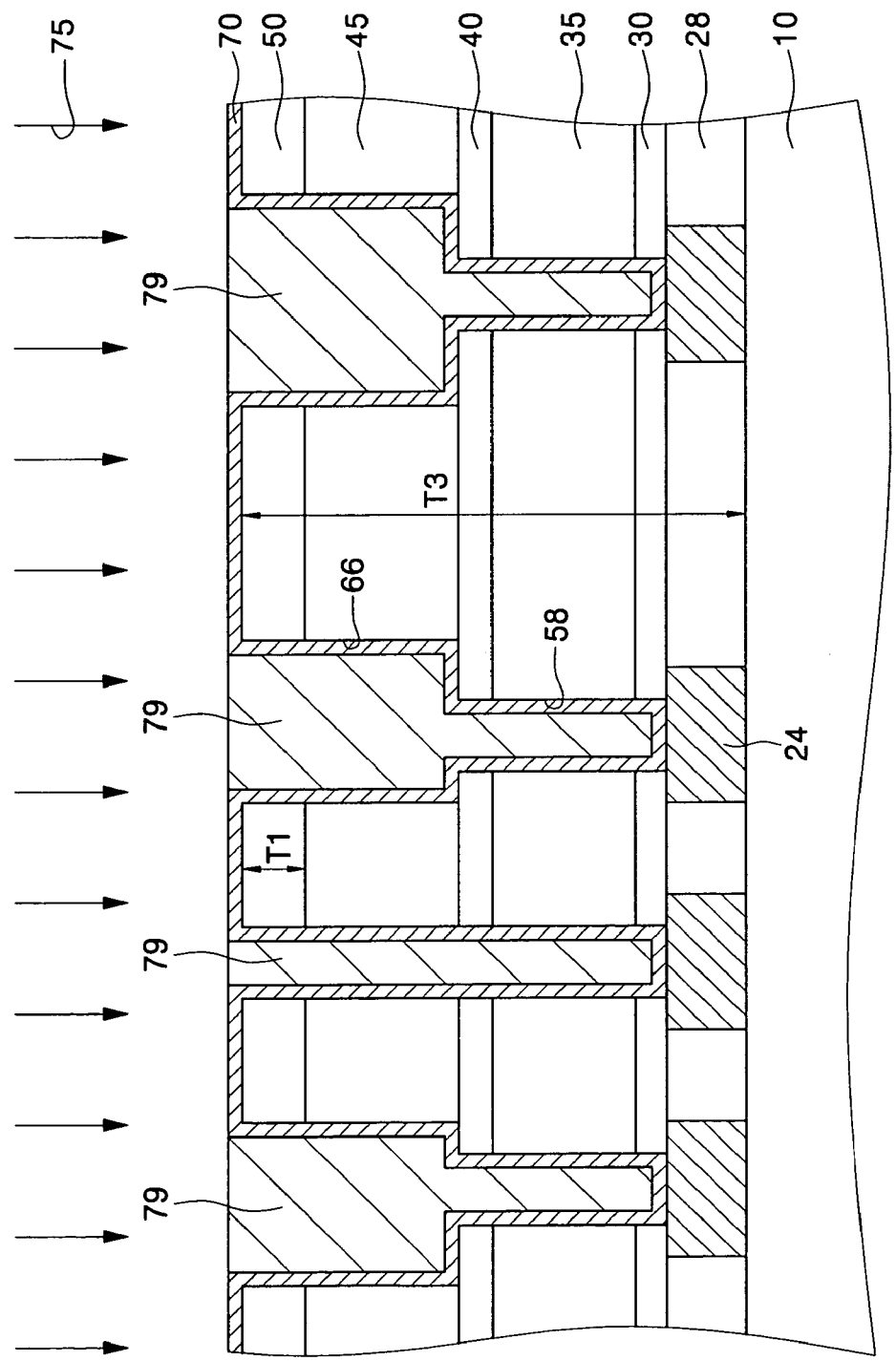
Figure 8:
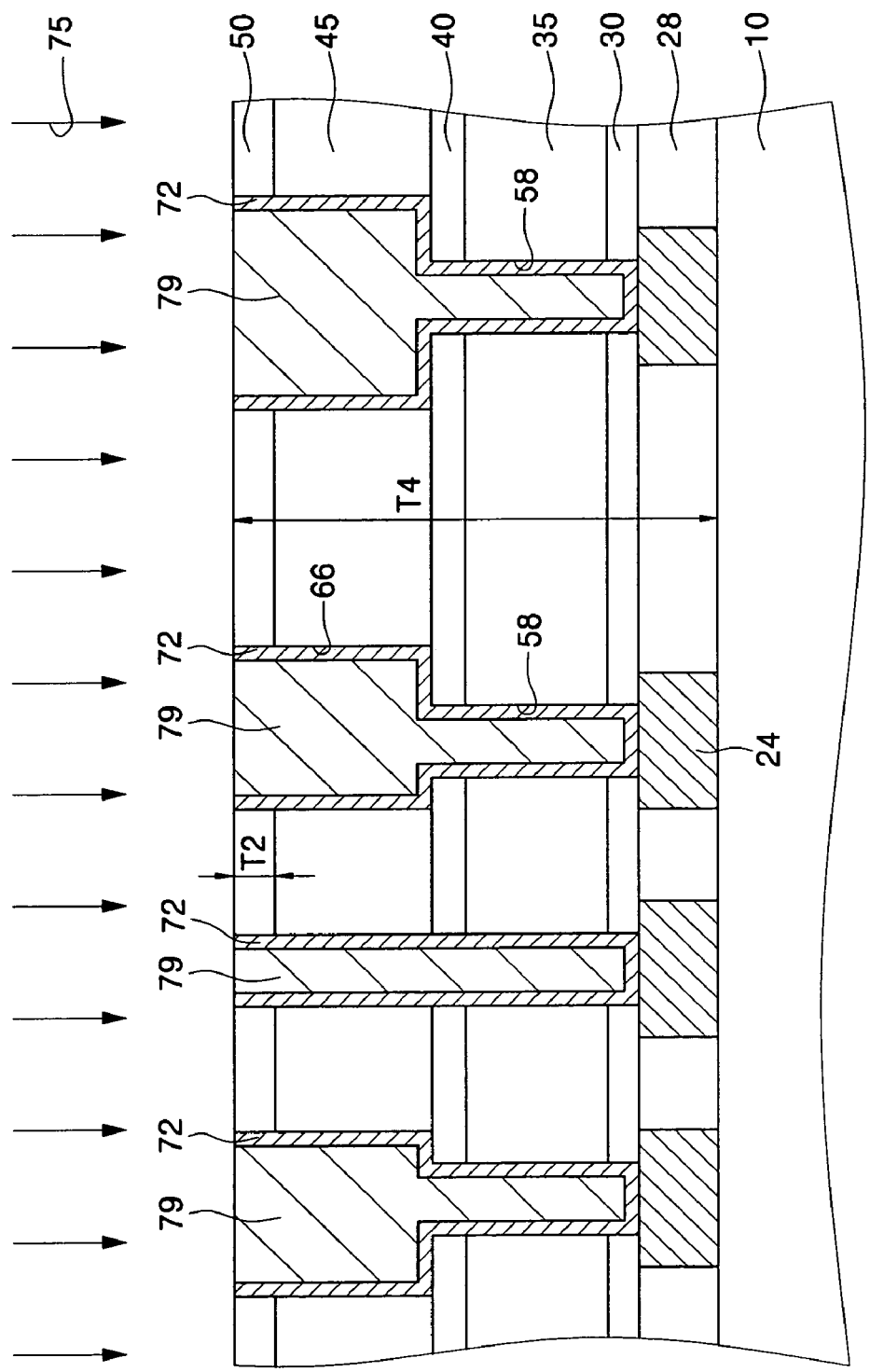

A first CMP process 75 is performed on the conductive layer 73 until the diffusion barrier layer 70 is exposed. The first CMP process 75 forms upper patterns 79 as shown in FIG. 7 to extend from the via contact holes 58 and fill the trenches 66 respectively. At this time, the first CMP process 75 is performed to expose the diffusion barrier layer 70 and the sacrificial layer 50 at edge regions A, C and a central region B of the semiconductor substrate 10 of FIG. 1. The diffusion barrier layer 70 of the boundary regions A, C of the semiconductor substrate 10 is illustrated in FIG. 7. The sacrificial layer 50 of the central region B of the semiconductor substrate 10 is illustrated in FIG. 8. However, a thickness of the sacrificial layer 50 may not be maintained uniform in FIGS. 7 and 8 on the overall surface of the semiconductor substrate 10 because of distribution of the polishing process in the first CMP process 75. Thus, the first CMP process 75 is performed such that the sacrificial layer 50 is maintained with a predetermined thickness T1 on the edge regions A, C of the semiconductor substrate 10. The first CMP process 75 is performed such that the sacrificial layer 50 is maintained with a predetermined thickness T2 at the central portion B of the semiconductor substrate 10. After the first CMP process 75 is performed, a thickness T3 of the buried interlayer insulating layer 28 to the sacrificial layer 50 on the edge regions A, C of the semiconductor substrate 10 is different from a thickness T4 of the buried interlayer insulating layer 28 to the sacrificial layer 50 at the central region B of the semiconductor substrate 10.

Referring to FIG. 1 and FIGS. 9 to 11, a second CMP process 77 is continuously performed such that the planarized interlayer insulating layer 45 is exposed on the edge regions A, C and the central region B of the semiconductor substrate 10. The second CMP process 77 is preferably performed for a predetermined time to partially remove the planarized interlayer insulating layer 45. The second CMP process 77 may be performed by employing abrasive for increasing an etching ratio of the sacrificial layer 50 as compared with an etching ratio of the planarized interlayer insulating layer 45. The abrasive may use silica, alumina, or ceria.

Figure 9:
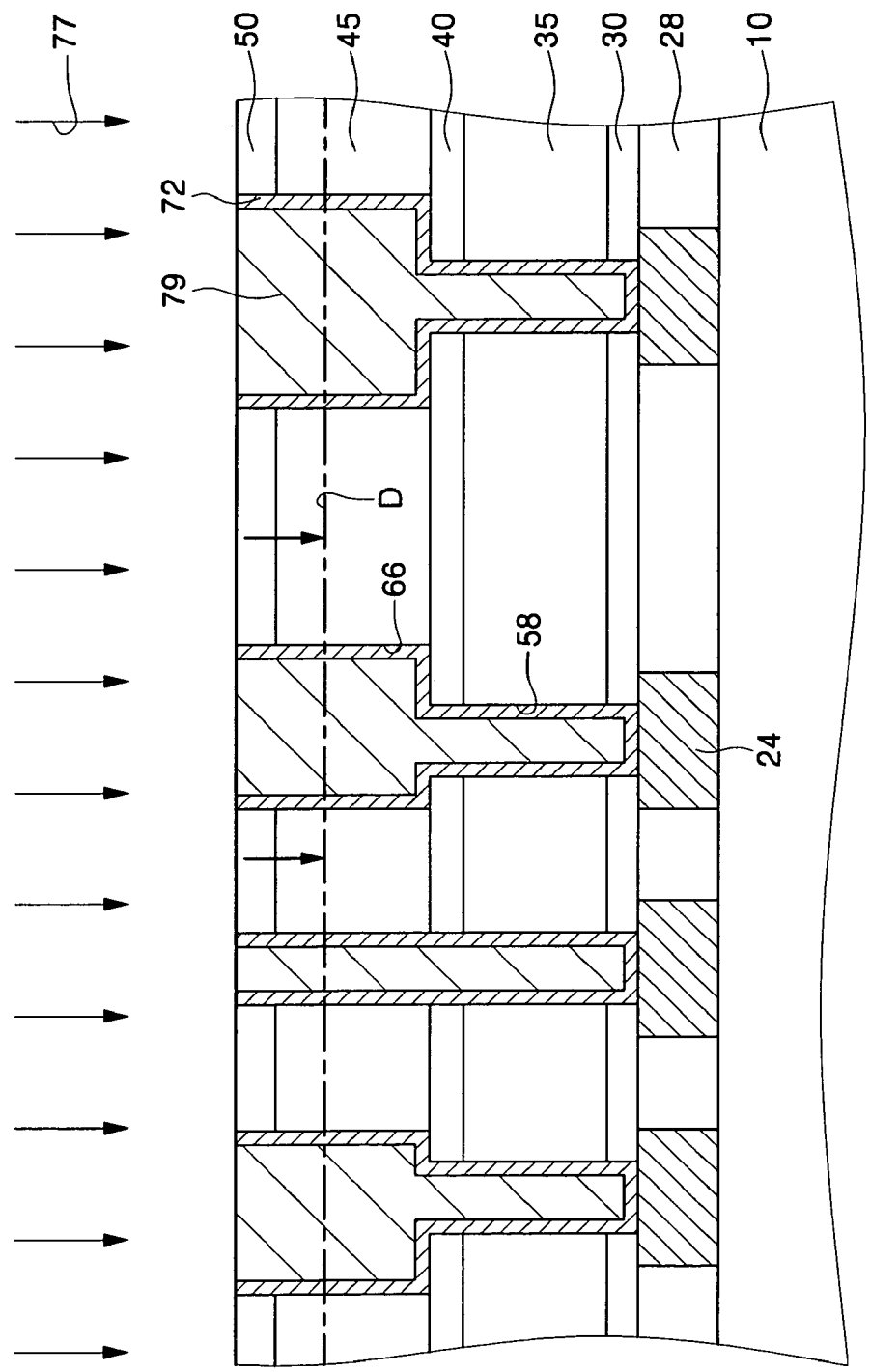
Figure 10:
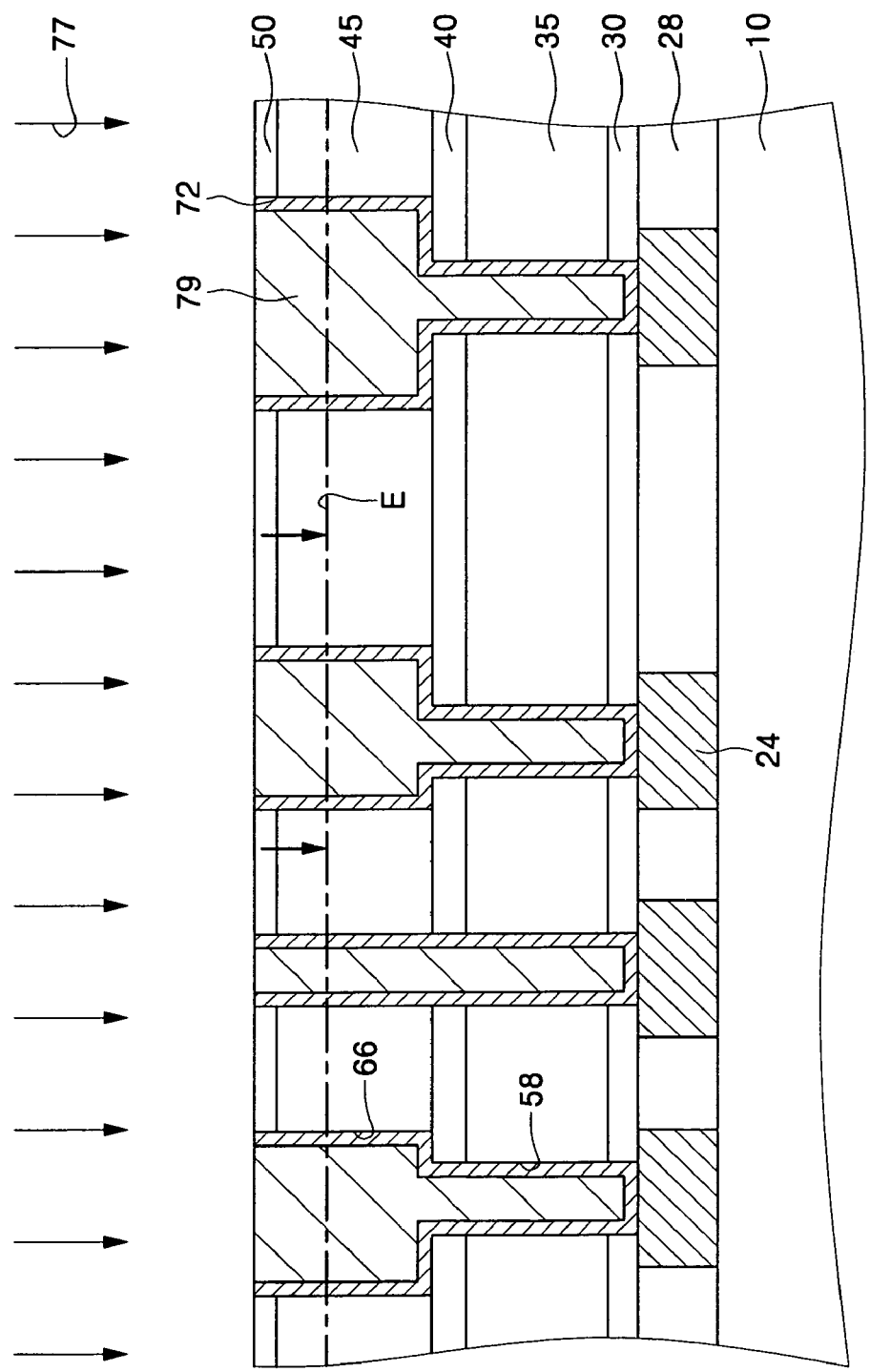

In the meantime, the second CMP process 77 may be performed to remove the diffusion barrier layer 70 and the sacrificial layer 50 on the edge regions A, C and the central region B of the semiconductor substrate 10, and to expose the planarized interlayer insulating layers 45 on the horizontal lines D, E of FIGS. 9 and 10. The second CMP process 77 forms diffusion barrier layer patterns 72 and the upper patterns 79 to fill the via contact holes 58 and the trenches 66 sequentially on the edge regions A, C and the central region B of the semiconductor substrate 10.

Figure 11:
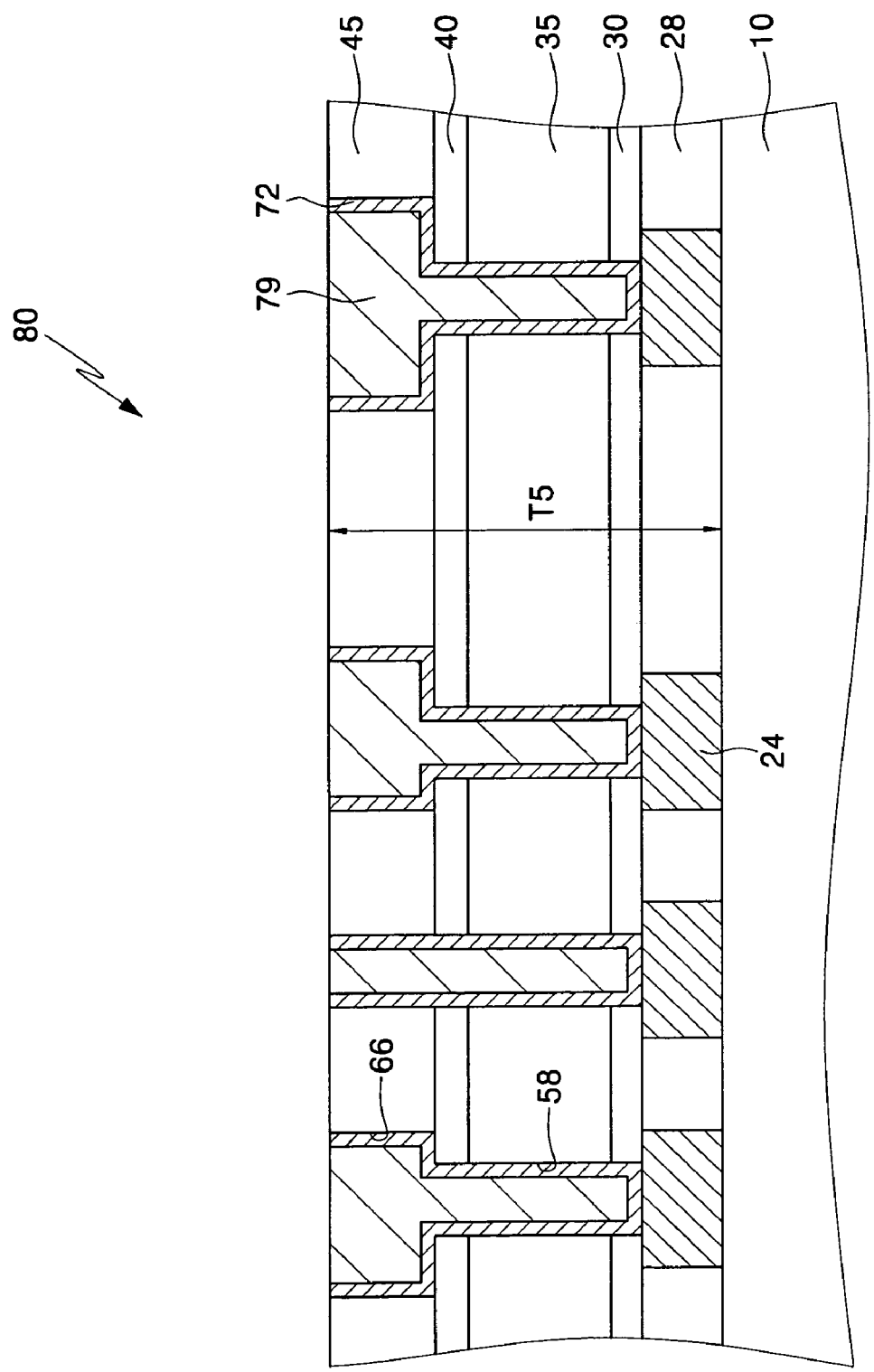

After the performance of the second CMP process 77, the buried interlayer insulating layer 28 to the planarized interlayer insulating layer 45 on the edge regions A, C and the central region B of the semiconductor substrate 10 is formed with a uniform thickness T5 as shown in FIG. 11. The second CMP process 77 is performed to planarize the upper surface of the semiconductor substrate 10 is planarized, thereby fabricating a semiconductor device 80.

Figure 12:
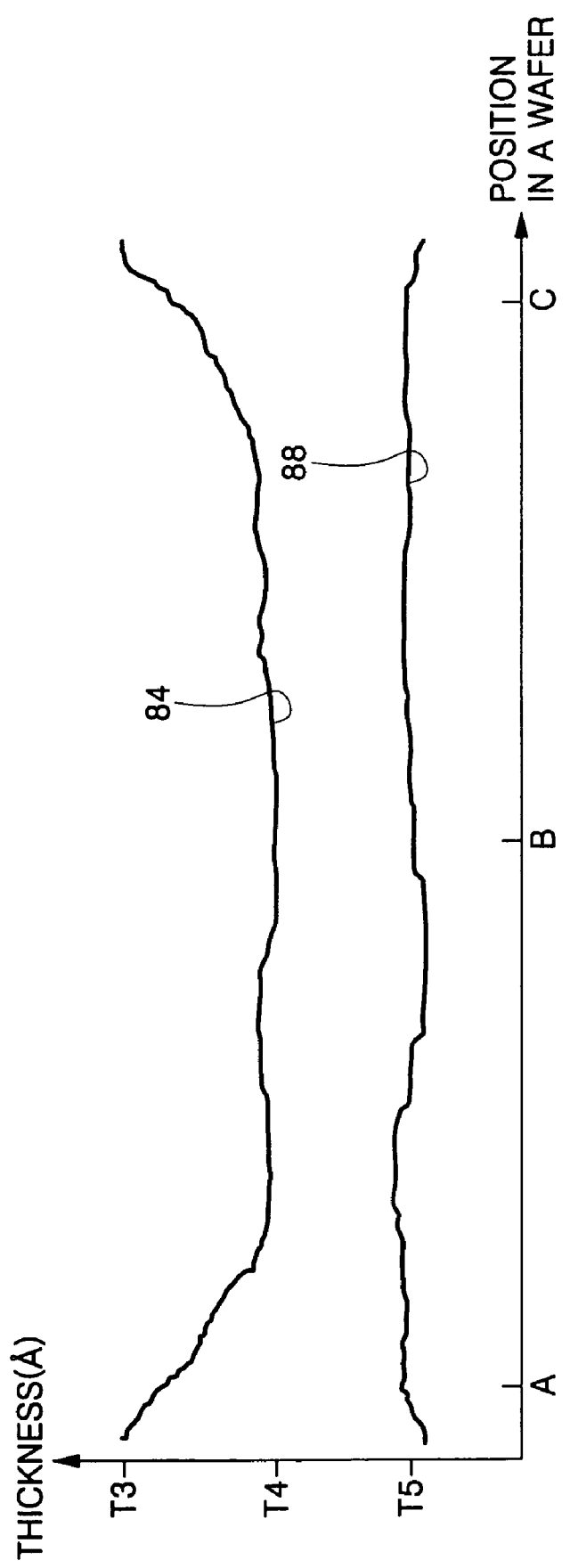
FIG. 12 is a graph illustrating a thickness distribution on the overall surface of a semiconductor substrate taken along line I-I' of FIG. 1.
Figure 13:
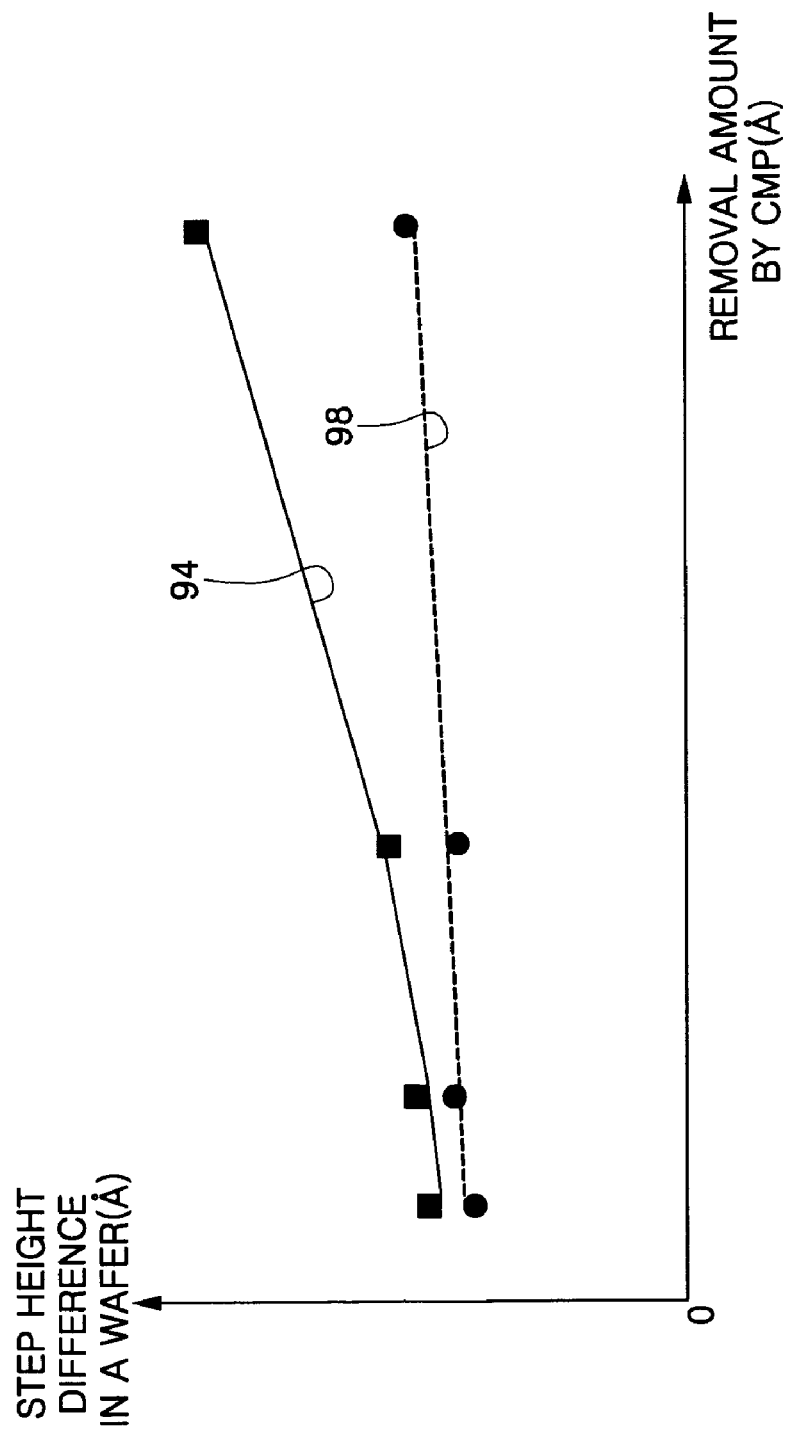
FIG. 13 is a graph illustrating a step height difference on a semiconductor substrate through chemical mechanical polishing (CMP) processes according to the present invention.

FIG. 12 is a graph illustrating a thickness distribution on the overall surface of a semiconductor substrate taken along line I-I' of FIG. 1. FIG. 13 is a graph illustrating a step height difference on a semiconductor substrate through chemical mechanical polishing (CMP) processes according to the present invention.

Referring to FIG. 1 and FIGS. 12 and 13, after the performance of the first and second CMP processes 75, 77, thicknesses of the layers on the semiconductor substrate 10 are measured. The thickness measurement may be made with respect to the buried interlayer insulating layer 28 to the sacrificial layer 50 and the buried interlayer insulating layer 28 to the planarized interlayer insulating layer 45 on the edge regions A, C and the central region B of the semiconductor substrate 10. Thus, the thickness distributions of the thickness measurement results on the overall surface of the semiconductor substrate 10 are illustrated by trend lines 84, 88 in FIG. 12 after the performance of the first and second CMP processes 75, 77.

After the performance of the first CMP process 75, one trend line 84 of the trend lines illustrates that the buried interlayer insulating layer 28 to the sacrificial layer 50 have different thicknesses on the edge regions A, C and the central region B of the semiconductor substrate 10. That is, the buried interlayer insulating layer 28 to the sacrificial layer 50 on the edge regions A, C of the semiconductor substrate 10 have a predetermined thickness distribution in a range of T3 through T4. The buried interlayer insulating layer 28 to the sacrificial layer 50 on the central region B of the semiconductor substrate 10 have thicknesses around a predetermined thickness T4. From the result, the upper surface of the semiconductor substrate 10 cannot be planarized through the performance of the first CMP process 75.

After the performance of the second CMP process 77, the other one 88 of the trend lines illustrates that the buried interlayer insulating layer 28 to the sacrificial layer 50 have a uniform thickness distribution on the edge regions A, C and the central region B of the semiconductor substrate 10. That is, the buried interlayer insulating layer 28 to the sacrificial layer 50 on the edge regions A, C and the central region B of the semiconductor substrate 10 have thicknesses around a predetermined thickness T5. Thus, the upper surface of the semiconductor substrate 10 is planarized through the performance of the second CMP process 77.

Trend lines 94, 98 of step height differences on the overall surface of the semiconductor substrate 10 according to the first and second CMP processes 75, 77 are illustrated in FIG. 13 depending on use of the sacrificial layer 50. An x-axis of FIG. 13 represents a removal amount of the conductive layer 73, the diffusion barrier layer 70, the sacrificial layer 50, and the planarized interlayer insulating layer 45, which are removed from the semiconductor substrate 10 through the first and second CMP processes 75, 77, in accordance with process times. A y-axis of FIG. 13 represents differences between a maximum value and a minimum value of the layer thicknesses from a selective layer on the overall surface of the semiconductor substrate 10, which are defined as step height differences, in accordance with process time. The first and second CMP processes 75, 77 are performed to have the other trend line 98 different from a trend line 94 shown in the case that the sacrificial layer 50 is not formed on the planarized interlayer insulating layer 45. The trend lines 94, 98 have different slopes from each other in accordance with process times of the first and second CMP processes 75, 77. As shown in the drawing, planarization characteristics on the overall surface of the semiconductor substrate 10 is more degraded in the case of not using the sacrificial layer 50 on the planarized interlayer insulating layer 45. On the contrary, the first and second CMP processes 75, 77 according to the present invention planarize the upper surface of the semiconductor substrate 10 because of the existence of the sacrificial layer 50 on the planarized interlayer insulating layer 45.

As described above, the present invention provides a method of planarizing the upper surface of the semiconductor substrate by forming a sacrificial layer on a planarized interlayer insulating layer. Thus, the methods of fabricating semiconductor devices using the sacrificial layer increase process margins of semiconductor fabrication processes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device comprising:
    forming a pad layer, a pad interlayer insulating layer, an etch stop layer, a planarized interlayer insulating layer, and a sacrificial layer sequentially on a semiconductor substrate;
    forming at least one trench in the sacrificial layer and the planarized interlayer insulating layer, and forming at least one via contact hole in the etch stop layer, the pad interlayer insulating layer, and the pad layer, the via contact hole being formed under the trench;
    forming a diffusion barrier layer and a conductive layer sequentially on the sacrificial layer to fill the trench and the via contact hole; and
    performing a first chemical mechanical polishing (CMP) process at least one time to expose the conductive layer, the diffusion barrier layer, and to remove a portion of the sacrificial layer to expose a remaining portion of the sacrificial layer; and
    performing a second CMP process until the remaining portion of the sacrificial layer is removed and the planarized interlayer insulating layer is exposed and at least partially removed.

2. The method according to claim 1, wherein during performing the CMP process, the CMP process uses an abrasive for increasing an etching ratio of the sacrificial layer as compared with an etching ratio of the planarized interlayer insulating layer.

3. The method according to claim 2, wherein the abrasive comprises at least one of silica, alumina, and ceria.

4. The method according to claim 1, wherein in a case in which the planarized interlayer insulating layer is formed using fluorine-doped silicon glass (FSG), the sacrificial layer is formed using a material selected from the group consisting of BPSG, SiON and low-k material.

5. The method according to claim 4, wherein the low-k material comprises a material having a dielectric constant in the range of about 2.4-3.0.

6. The method according to claim 1, wherein in a case in which the planarized interlayer insulating layer is formed using a low-k material having a dielectric constant in the range of about 2.4-3.0, the sacrificial layer is formed using a lower-k material having a lower dielectric constant than that of the low-k material.

7. The method according to claim 6, wherein the lower-k material is formed using at least one of nanoporous, BCB, Flare, ALCAP, and LKD dielectric materials.

8. The method according to claim 1, wherein the etch stop layer and the pad layer are formed using an insulating layer having an etching ratio different from that of the pad interlayer insulating layer.

9. A method of fabricating a semiconductor device comprising:
    forming a pad layer, a pad interlayer insulating layer, an etch stop layer, a planarized interlayer insulating layer, and a sacrificial layer sequentially on a semiconductor substrate;
    forming at least one trench in the sacrificial layer and the planarized interlayer insulating layer, and forming at least one via contact hole in the etch stop layer, the pad interlayer insulating layer, and the pad layer, the via contact hole being formed under the trench;
    forming a diffusion barrier layer and a conductive layer sequentially on the sacrificial layer to fill the trench and the via contact hole; and
    performing a first chemical mechanical polishing (CMP) process at least one time to expose the conductive layer, the diffusion barrier layer, and to remove a portion of the sacrificial layer to expose a remaining portion of the sacrificial layer; and
    performing a second CMP process until the remaining portion of the sacrificial layer is removed and the planarized interlayer insulating layer is exposed and at least partially removed, wherein the sacrificial layer is formed using an insulating layer having a higher etching ratio than that of the planarized interlayer insulating layer.

10. The method according to claim 9, wherein in a case in which the planarized interlayer insulating layer is formed using fluorine-doped silicon glass (FSG), the sacrificial layer is formed using a material selected from the group consisting of BPSG, SiON and low-k material.

11. The method according to claim 10, wherein the low-k material is formed having a dielectric constant in the range of about 2.4-3.0.

12. The method according to claim 9, wherein in a case in which the planarized interlayer insulating layer is formed using a material having a dielectric constant in the range of about 2.4-3.0, the sacrificial layer is formed using a lower-k material having a lower dielectric constant than that of the low-k material.

13. The method according to claim 12, wherein the lower-k material is formed using at least one of nanoporous, BCB, Flare, ALCAP, and LKD dielectric materials.

14. The method according to claim 9, wherein the etch stop layer and the pad layer are formed using an insulating layer having an etching ratio different from that of the pad interlayer insulating layer.

* * * * *